(12) United States Patent
Friedman et al.

(10) Patent No.: US 7,000,063 B2
(45) Date of Patent: Feb. 14, 2006

(54) WRITE-MANY MEMORY DEVICE AND METHOD FOR LIMITING A NUMBER OF WRITES TO THE WRITE-MANY MEMORY DEVICE

(75) Inventors: David R. Friedman, Menlo Park, CA (US); J. James Tringali, Los Altos, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 342 days.

(21) Appl. No.: 09/972,787

(22) Filed: Oct. 5, 2001

(65) Prior Publication Data

US 2003/0070034 A1   Apr. 10, 2003

(51) Int. Cl.
*G06F 12/14* (2006.01)
(52) U.S. Cl. ...................................................... 711/103
(58) Field of Classification Search ................ 711/103, 711/154, 163
See application file for complete search history.

(56) References Cited

U.S. PATENT DOCUMENTS

| | | | |
|---|---|---|---|
| 5,153,462 A | 10/1992 | Agrawal et al. | |
| 5,264,740 A | 11/1993 | Wright | |
| 5,414,829 A | 5/1995 | Fandrich et al. | |
| 5,734,816 A * | 3/1998 | Niijima et al. | 395/182.06 |
| 5,737,742 A * | 4/1998 | Achiwa et al. | 711/103 |
| 6,034,882 A | 3/2000 | Johnson et al. | |
| 6,058,047 A * | 5/2000 | Kikuchi | 365/185.33 |
| 6,134,141 A | 10/2000 | Wong | |
| 6,151,246 A | 11/2000 | So et al. | |
| 6,181,603 B1 | 1/2001 | Jyouno et al. | |
| 6,219,282 B1 | 4/2001 | Tanaka | |
| 6,222,762 B1 | 4/2001 | Guterman et al. | |
| 6,236,587 B1 | 5/2001 | Gudesen et al. | |
| 6,278,633 B1 | 8/2001 | Wong et al. | |
| 6,363,008 B1 | 3/2002 | Wong | |
| 6,376,282 B1 | 4/2002 | Corisis | |
| 6,376,284 B1 | 4/2002 | Gonzalez et al. | |

OTHER PUBLICATIONS

"64M×8 Bit NAND Flash Memory," Samsung Electronics (Oct. 27, 2000).
"How Flash Memory Works," wysiwyg://8/http://www.howstuffworks.com/flash-memory.htm?printable=1, 5 pages (1998).
"Datalight FlashFX™ 4.06 User's Guide," p. 11 (Aug. 2000).

(Continued)

*Primary Examiner*—Kevin L. Ellis
(74) *Attorney, Agent, or Firm*—Brinks Hofer Gilson & Lione

(57) ABSTRACT

The preferred embodiments described herein provide a write-many memory device and method for limiting a number of writes to the write-many memory device. In one preferred embodiment, a write-many memory device is provided comprising a plurality of blocks of memory, each block being limited to N number of writes. Data can be stored in a block of memory only if there has been fewer than N number of writes to the block. In another preferred embodiment, a write-many memory device is provided comprising a plurality of blocks of memory, wherein each block comprises a first sideband field storing data indicating whether the block is free and a second sideband field storing data indicating how many times the block has been written into. The first and second sideband fields are used in a method for limiting a number of writes to the write-many memory device. Other preferred embodiments are provided, and each of the preferred embodiments can be used alone or in combination with one another.

45 Claims, 3 Drawing Sheets

OTHER PUBLICATIONS

"How Does TrueFFS® manage Wear Leveling?," http://www.m-sys.com/content/information/calcInfo.asp, 2 pages (printed Oct. 5, 2001).

"Intel StrataFlash™ Memory Technology Development and Implementation," Fazio et al., Intel Technology Journal, 13 pages (Q4'1997).

"A 125mm$^2$ 1Gb NAND Flash Memory with 10MB/s Program Throughput," Nakamura et al., ISSCC 2002/Session 6/SRAM and Non-Volatile Memories/6.4, 2002 IEEE International Solid-State Circuits Conference, Digest of Technical Papers, pp. 106-107 (2002).

"On the Go With Sonos," White et al., Circuits & Devices, pp. 22-31 (Jul. 2000).

"NROM: A Novel Localized Trapping, 2-Bit Nonvolatile Memory Cell," Eitan et al., IEEE Electron Device Letters, vol. 21, No. 11, pp. 543-545 (Nov. 2000).

"A 512Mb NROM Flash Data Storage Memory with 8MB/s Data Rate," Maayan et al., ISSCC 2002/Session 6/SRAM and Non-Volatile Memories/6.1, 2002 IEEE International Solid-State Circuits Conference, Digest of Technical Papers, pp. 100-101 (2002).

"Ovonic Unified Memory—A High-Performance Nonvolatile Memory Technology for Stand-Alone Memory and Embedded Applications," Gill et al., ISSCC 2002/Session 12/TD Digital Directions/12.4, 2002 IEEE International Solid-State Circuits Conference, Digest of Technical Papers, pp. 202-203 (2002).

"0.13 $\mu$m Metal-Oxide-Nitride-Oxide-Semiconductor Single Transistor Memory Cell with Separated Source Line," Fujiwara et al., Jpn. J. Appl. Phys. vol. 39, pp. 417-423, Part 1, No. 2A (Feb. 2000).

"Three-Dimensional Memory Array and Method of Fabrication," U.S. Appl. No. 09/560,626, filed Apr. 28, 2000, inventor: N. Johan Knall.

"Digital Memory Method and System for Storing Multiple-Bit Digital Data," U.S. Appl. No. 09/932,701, filed Aug. 17, 2001, inventors: Michael A. Vyvoda and N. Johan Knall.

"Memory Device and Method for Reliably Reading Multi-Bit Data from a Write-Many Memory Cell," U.S. Appl. No. 10/144,451, filed May 9, 2002, inventor: Bendik Kleveland.

* cited by examiner

WRITE-MANY MEMORY DEVICE AND METHOD FOR LIMITING A NUMBER OF WRITES TO THE WRITE-MANY MEMORY DEVICE

BACKGROUND

Users of write-many memory devices can be segmented into a variety of categories based on how many times they need to re-write the memory device and on what they are willing to spend for the memory device. Currently, there are no write-many memory devices that control the number of allowable writes (or re-writes) to the memory device. Accordingly, it is very difficult to segment the write-many memory device market into those willing to pay for two re-writes from those willing to pay for ten re-writes, for example.

Additionally, some write-many memory devices, such as Flash memory, are reliable only for a limited number of writes. A block of Flash memory can "wear out" and become "stuck" at one logic state after repeated erase operations due to the inability to remove all of the charge trapped in the oxide under a floating gate of a storage transistor. To equalize the wear (i.e., the number of erase times) of the Flash memory, a Flash Translation Layer (FTL) can employ a "wear leveling" algorithm to use all areas of the Flash memory in an equal manner. In operation, when a file stored in a block of memory needs to be updated, the FTL notices that the block is non-virgin and does not erase and overwrite the old data. Instead, the FTL writes the updated data to unused blocks of memory and directs subsequent read accesses to those blocks. The old data is marked as "old" and is not erased until the block has to be reused. Although the wear leveling algorithm tends to balance the wear on the blocks, a block can still wear out after repeated erase operations.

There is a need, therefore, for a write-many memory device and method for limiting a number of writes to the write-many memory device.

SUMMARY

The present invention is defined by the following claims, and nothing in this section should be taken as a limitation on those claims.

By way of introduction, the preferred embodiments described below provide a write-many memory device and method for limiting a number of writes to the write-many memory device. In one preferred embodiment, a write-many memory device is provided comprising a plurality of blocks of memory, each block being limited to N number of writes. Data can be stored in a block of memory only if there has been fewer than N number of writes to the block. In another preferred embodiment, a write-many memory device is provided comprising a plurality of blocks of memory, wherein each block comprises a first sideband field storing data indicating whether the block is free and a second sideband field storing data indicating how many times the block has been written into. The first and second sideband fields are used in a method for limiting a number of writes to the write-many memory device. Other preferred embodiments are provided, and each of the preferred embodiments can be used alone or in combination with one another.

The preferred embodiments will now be described with reference to the attached drawings.

BRIEF DESCRIPTION OF THE DRAWINGS

FIGS. 4A–4D are illustrations of a method of a preferred embodiment for limiting a number of writes to a write-many memory device.

DETAILED DESCRIPTION OF THE PRESENTLY PREFERRED EMBODIMENTS

The preferred embodiments described herein relate to a write-many memory device. The terms "memory device" and "storage device" will be used interchangeably herein. In a write-many memory device, an un-programmed digital state of a memory location (e.g., the Logic 0 (or Logic 1) state) can be restored after it is switched to a programmed digital state (e.g., the Logic 1 (or Logic 0) state). In this way, stored data can be erased and/or over-written with new data. The write-many memory device is preferably field-programmable so that the memory locations of the memory device can be programmed by a user at a time after the memory device has been manufactured. Any suitable type of write-many memory device can be used. For example, a write-many memory device can take the form of a solid-state storage device (such as Flash memory) or a magnetic storage device. If a memory device with a memory array is used, the memory array can be two-dimensional or three-dimensional and be made of any suitable material (e.g., semiconductor, phase-change, amorphous solids, MRAM, or organic passive elements). Preferably, the write-many memory device is non-volatile so that it maintains its contents without any external source of power. It is preferred that the write-many memory device take the form described in "Dense Arrays and Charge Storage Devices, and Methods for Making Same," U.S. patent application Ser. No. 09/927,648, filed Aug. 13, 2001, which is hereby incorporated by reference.

Figure 1:
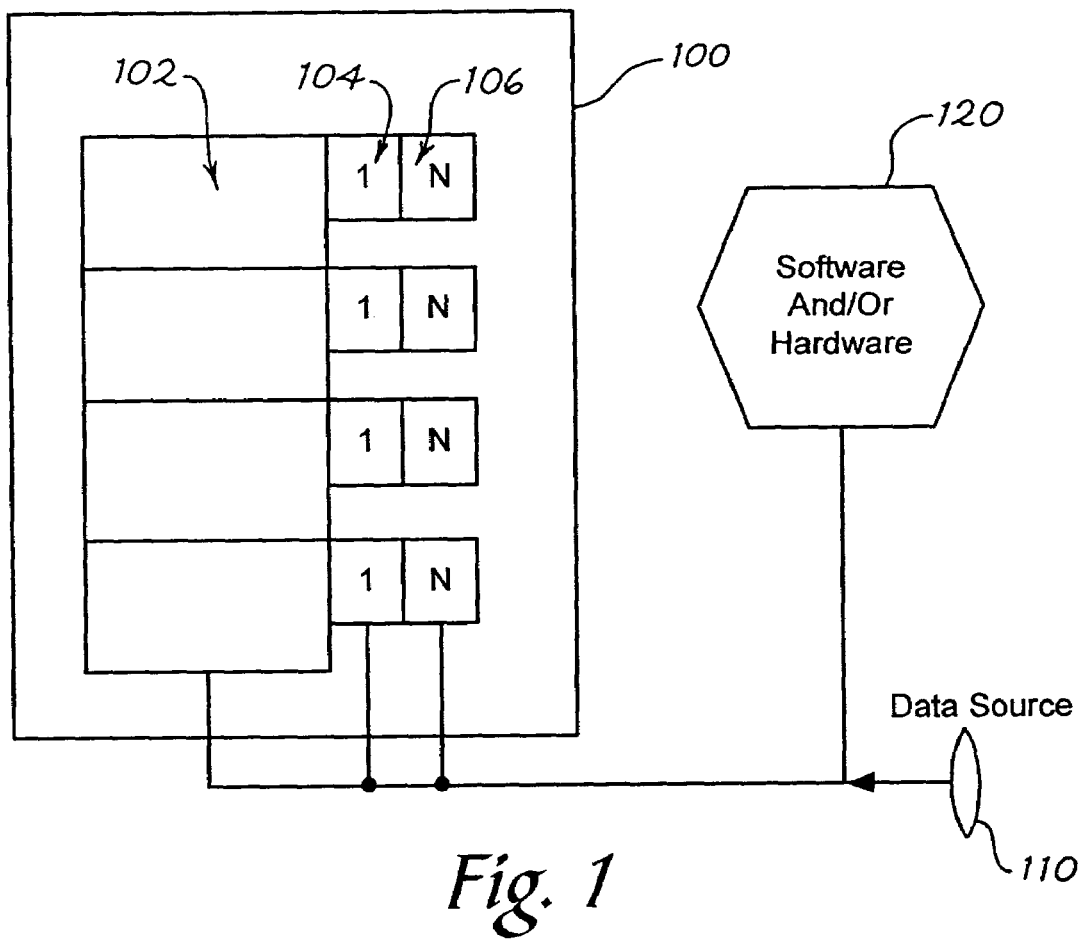
FIG. 1 is an illustration of a write-many memory device with sideband fields of a preferred embodiment.

Turning now to the drawings, FIG. 1 is an illustration of a write-many memory device 100 of a preferred embodiment. The write-many memory device 100 is in communication with a data source 110 and software and/or hardware components 120 that are operative to store data supplied by the data source 110 in the write-many memory device 100. The data source 110 can be a component that itself generates data (e.g., part of a digital camera that generates a digital picture) or can be a component that receives data from another source such as a network (e.g., the Internet) or another computer. "Data" can take any suitable form, such as, but not limited to, digital images, video, audio, books, maps, and numerous other examples that will be readily apparent to those skilled in the art.

Figure 2:
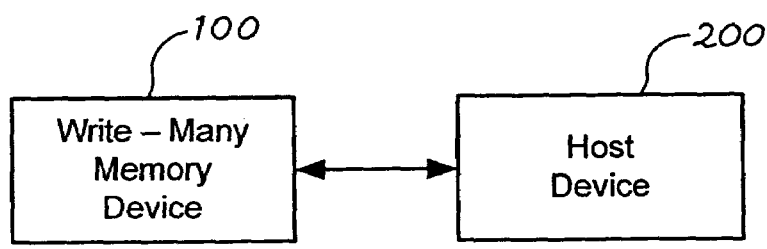
FIG. 2 is a block diagram of a write-many memory device coupled with a host device of a preferred embodiment.

The write-many memory device 100, the data source 110, and the software and/or hardware components 120 can be integrated together in a single system, such as a general purpose or application-specific computing system. Alternatively, as shown in FIG. 2, the write-many memory device 100 can be a removable device that couples with a host device 200, which contains the data source 110 and the software and/or hardware components 120. As used herein, "coupled with" means directly coupled with or indirectly coupled with through one or more named or unnamed intervening components. In one embodiment, the write-many memory device 100 takes the form of a compact, modular device, such as a card or a stick with an exposed electrical connector, that is readily inserted into and removed from a corresponding port in the host device 200. The host device 200 can be a consumer electronic device, such as a digital camera, a digital audio player, a personal digital assistant, a cellular telephone, a game player, a digital book, or a general-purpose computer. The memory device 100 can be used to store data generated by the host device 200 and can also be used to transfer data from the host device 200 to another device (e.g., from a PC to a PDA).

Returning to FIG. 1, the write-many memory device 100 of this preferred embodiment has a plurality of blocks 102 of memory, each block comprising two sideband fields 104, 106. As used herein, a "block" refers to an allocation unit of memory. A block can be of any size. For example, a block can include one memory unit, more than one memory unit, or all of the memory units in the memory device 100. If files to be stored in the memory device 100 are of a single size, it may be preferred to match the size of a block to the size of the file so that a file is stored in a single block. If files to be stored in the memory device 100 are of different sizes, it may be preferred to design the size of a block to be smaller than the size of a file. This finer granularity reduces the potential for wasted space. In one preferred embodiment, a block contains 512 bytes of memory that can be written into by a user of the memory device 100. Each block is associated with 16 bytes of "reserved" memory that is not user accessible. At least some of the 16 bytes are used for the first and second sideband fields 104, 106. The 512-byte block and its associated 16-byte reserved memory is referred to as a "page."

The first and second sideband fields 104, 106 are used in a method for limiting a number of writes to the write-many memory device 100. The first sideband field 104 stores data indicating whether its associated block 102 is free. A block is free if the block does not contain data that should not be overwritten or erased. In one preferred embodiment, the first sideband field 104 stores a "1" if the block 102 is free and stores a "0" if the block 102 is not free. The second sideband field 106 stores data indicating how many times the block 102 has been written into. For example, the second sideband field 106 can store a count of how many times the block 102 has been written into, and each time the block 102 is written into, the count is increased. Alternatively, the second sideband field 106 can store a count representing the remaining number of times that the block 102 can be written into, and this count is decremented each time the block 102 is written into. In either alternative, the count can represent the number of re-writes instead of the number of writes.

As will be discussed in greater detail below, the data stored in the second sideband fields 106 can be preset by a manufacturer of the memory device 100 to limit the number of writes to a certain number, N. In this way, data is stored in the block 102 only if there have been fewer than N number of writes to the block 102. The memory device 100 can be preset by the manufacturer so that it writes as few as one time (resulting in the write-many memory device operating as a WORM) or as many times as desired, preferably not more than (i.e., equal to or fewer than) the maximum allowable qualified writes (if such a maximum exists). As used herein, a "manufacturer" of a memory device refers to any party who handles the memory device before it is sold or distributed to an end user (e.g., a consumer). A "manufacturer" can include a party involved in the manufacturing, assembly, packaging, sale, or distribution of the memory device.

Figure 3:
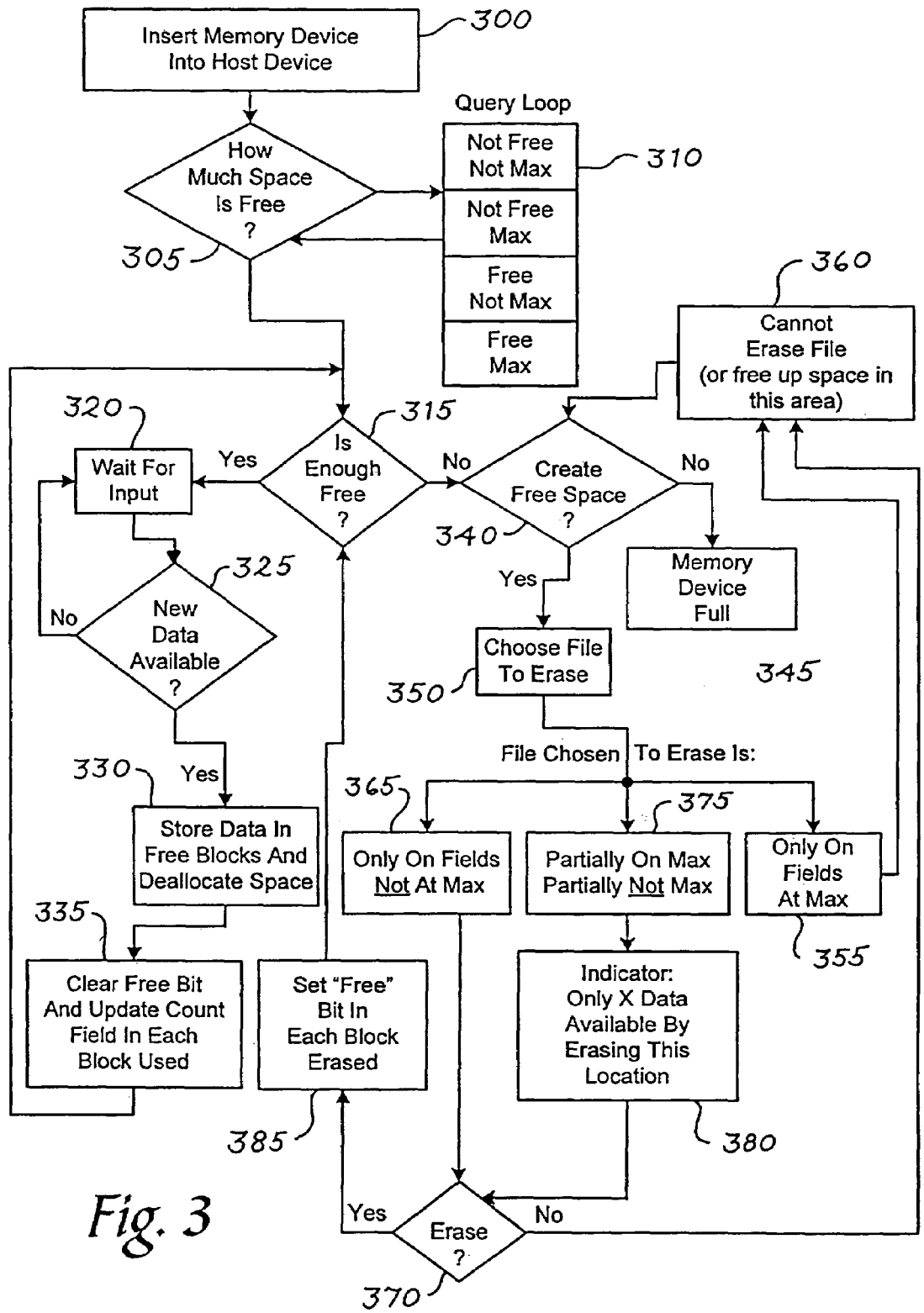
FIG. 3 is a flow chart of a method of a preferred embodiment for limiting a number of writes to a write-many memory device.

Turning again to the drawings, FIG. 3 is a flow chart of a method of a preferred embodiment for limiting a number of writes to a write-many memory device. As shown in FIG. 3, the memory device 100 is first inserted into the host device 200 (act 300). The host device 200 then determines how much space is free in the memory device 100 (act 305). To do this, the host device 200 runs a query loop (act 310) that determines how many blocks of memory are free (i.e., how many blocks have first sideband fields containing a "1"). Additionally, the query loop determines how many blocks have been written into a maximum number of times. This data is aggregated into four categories in a run-time allocation table: (1) not free; not max, (2) not free; max, (3) free; not max, and (4) free; max. Next, the host device 200 checks the allocation table and determines if there is enough free space (i.e., enough blocks with a "1" in the first sideband field) to store data of an expected size based on user specifications (act 315). For example, if the host device 200 is a digital camera, the host device 200 can determine if there is enough space available on the memory device 110 to store a new picture given the quality setting and compression ratio set by the user. This determination is made before the user is allowed to take a new picture (i.e., the determination is made before run-time). If there is enough free space, the host device waits for input (act 320) and determines if new data is available (act 325).

Figures 4A, 4B, 4C, 4D:
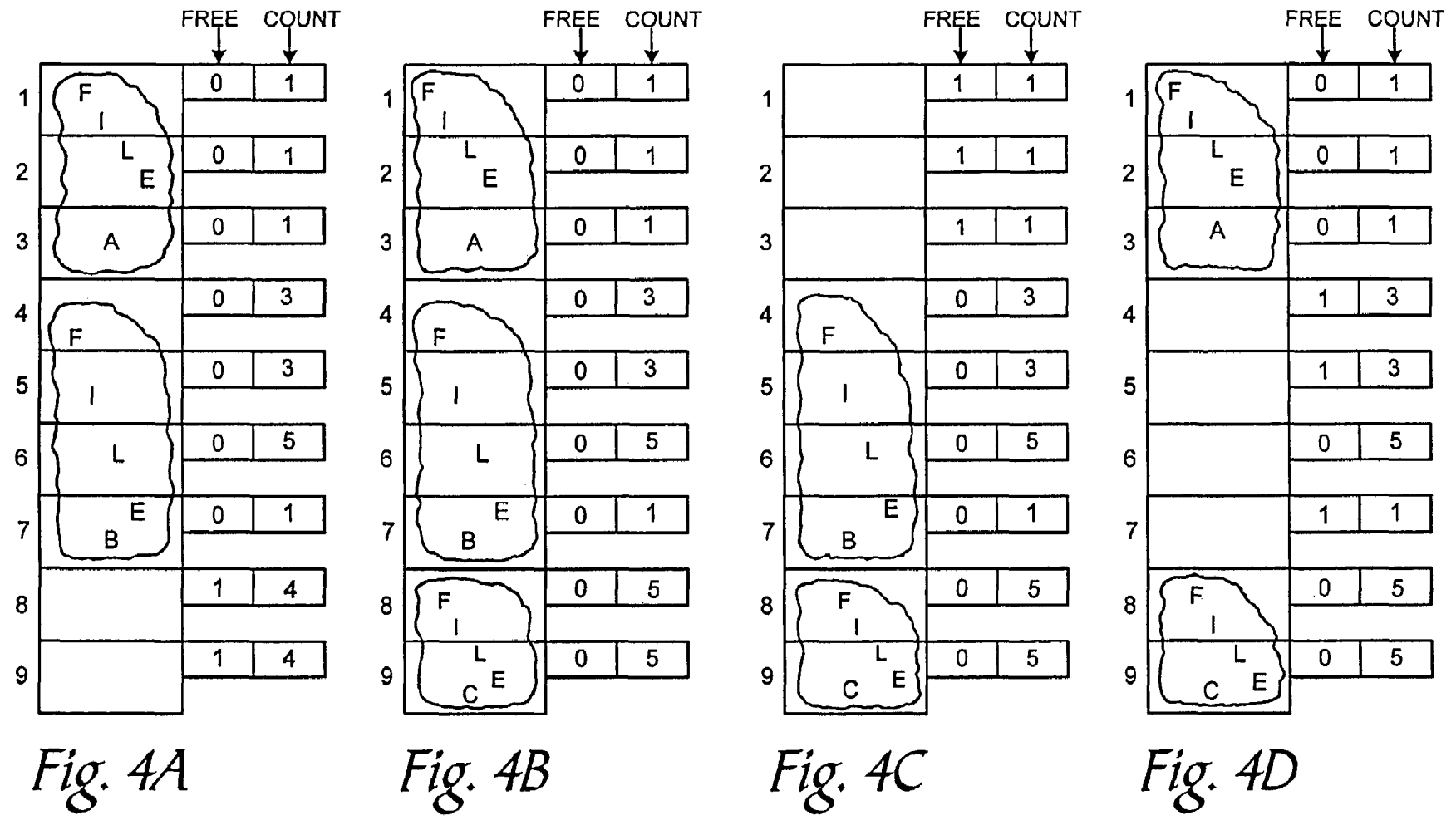

If new data is available, the host device 200 stores the data in at least some of the free blocks and de-allocates that space from the amount indicated in the free; not max and/or free; max categories of the run-time allocation table (act 330). Then, in each block that was used to store the data, the free bit in the first sideband field is cleared (e.g., set from 1 to 0) to indicate that the block is not free, and the data in the second sideband field (the "count" field) is updated to indicate that the block was used (act 335). An example of this process is shown in FIGS. 4A and 4B. FIG. 4A shows a memory device with nine blocks (blocks 1–9). File A is stored in blocks 1–3, and File B is stored in blocks 4–7. Accordingly, Blocks 1–7 are not free (i.e., the first sideband fields contain a 0), and blocks 8 and 9 are free (i.e., the first sideband fields contain a 1). As shown in FIG. 4B, when a two-block long file (File C) is stored in free blocks 8 and 9, the free bit in the first sideband fields of blocks 8 and 9 is cleared (switched from 1 to 0), and the data in the second sideband fields of blocks 8 and 9 is updated (from 4 to 5).

Returning to the flow chart of FIG. 3, after act 335 is performed, the host device 200 again determines if there is enough free space to store data of an expected size (act 315). As described above, in act 330, the host device 200 de-allocates the space used to store the file from the amount indicated in the free; not max and/or free; max categories in the run-time copy of the allocation table created in act 305. Because a run-time copy is used, act 305 does not need to be re-performed, thereby saving time and resources in the host device 200. In an alternate embodiment, instead of de-allocating space in a run-time copy of the allocation table in act 330, the host device 200 can re-run the query loop (acts 305 and 310) after each write operation.

If the host device 200 determines that there is not enough free space, the user is given the option of creating free space (act 340). If the user does not want to create free space (e.g., the user does not want to delete any of the stored files), the memory device 100 will be considered full by the host device 200 (act 345). If the user does want to create free space, the user will be asked to choose a file to erase from the memory device 100 (act 350). The host device 200 then determines whether some or all of the blocks storing the selected file have been written into a maximum number of times (in this example, the maximum number is 5). If the selected file is stored only in blocks that have been written into a maximum number of times (scenario 355), such as File C in FIG. 4B, then the host device 200 prevents the user from erasing the file (act 360) since erasing the file would not create free space to store a new file. Of course, the user can be given the option to override this protection. If the selected file is stored only in blocks that have been written into fewer than the maximum number of times (scenario 365), the user is given the option to erase the file (act 370). If the selected file is stored both in blocks that have been written into fewer than the maximum number of times and in blocks that have been written into the maximum number of times (scenario 375), such as File B in FIG. 4B, the user is provided with an indicator alerting him that erasing the file will only free some of the space occupied by the file (act 380). The user is then given the option to erase the file (act 370). The user may choose not to erase the file after knowing that the erasure of the file will not create the space needed to store a new file.

If the user chooses to erase a file stored only in blocks that have been written into fewer than the maximum number of times, the free bit is set in the first sideband fields of each of the erased blocks. For example, as shown in FIG. 4C, if the user selects to erase File A, which is stored only in blocks that have been written into fewer than the maximum number of times, the first sideband fields of blocks 1–3 are set from 0 to 1. If the user chooses to erase a file stored both in blocks that have been written into fewer than the maximum number of times and in blocks that have been written into the maximum number of times, the free bit is set in the first sideband fields of each of the erased blocks that have not been written into a maximum number of times. Consider, for example, the situation in which a user erases File B. Some of the blocks storing File B (blocks 4, 5, and 7) have been written into fewer than the maximum number of times, while block 6 has been written into the maximum number of times. As shown in FIG. 4D, when File C is erased, the free bit is set in the first sideband fields of blocks 4, 5, and 7 but not in block 6. This prevents block 6 from being written into again.

With some write-many technologies, old data in a block can be overwritten with new data without first returning the cells of the block to their un-programmed digital state. With these technologies, the erase operation sets the free bit in the first sideband field of the block but does not necessarily return the cells of the block to their un-programmed digital state. In this way, the erase operation is simply a bookkeeping function (i.e., setting the free bit in the first sideband field). However, with other write-many technologies, such as Flash memory, the cells of a block must be returned to their un-programmed digital state before new data can be written into the block. With these technologies, the erase operation both sets the free bit in the first sideband field of the block and returns the cells of the block to their un-programmed digital state.

There are several applications that can be used with this preferred embodiment. For example, this preferred embodiment can be used by a manufacturer of memory devices to provide a consumer with an alternative to conventional write-once and write-many memory devices. As discussed above, users of write-many memory devices can be segmented based on how many times they need to write to the memory device and on what they are willing to spend for the memory device. With this preferred embodiment, a memory device manufacturer can create a variety of write-many memory devices with different maximum number of writes, and these memory devices can be priced at different levels depending on their maximum number of writes. This selection allows a consumer to purchase the memory device with the write capability and price that he desires. For example, instead of merely deciding between a write-once memory device or a write-many memory device, a consumer can decide to purchase a "Write-5" memory device or a "Write-10" memory device. The "Write-5" and "Write-10" memory devices can be priced between the write-once and write-many memory devices, with the "Write-10" memory device being more expensive than the "Write-5" memory device.

In another application, the maximum number of writes is used to limit the use of a program stored in the memory device. Consider, for example, an interactive computer game stored on a write-many memory device that stores data on the memory device as the user interacts with the game. Limiting the number of writes to the write-many memory device effectively limits the user's opportunity to interact with the game. When the memory device no longer accepts user interaction, a user would be motivated to purchase a new game card. There are many additional applications that can be created around the functionality of limiting the number of writes to the write-many memory device. For example, applications can be developed for Smart Cards that only allow a user to interact with a record a limited number of times before the record is "frozen" on the card.

In yet another use of this preferred embodiment, the maximum number of writes to the memory device is set to assure a quality write to the memory device. As discussed above, some write-many memory devices are reliable only for a limited number of uses. Setting the maximum number of writes at or below the maximum allowable qualified number of uses will prevent a user from using the memory device for more writes than the memory device should be expected to handle. The control logic implemented in the software and/or hardware components 120 can be modified to accommodate the quality and reliability-related use of this preferred embodiment. For example, it may be preferred to switch the order of acts 330 and 335 in the flow chart of FIG. 3 so that the count field is updated before data is stored in the memory device 100. If there is an error writing data to a block, the host device 200 may attempt to write the data to the block several times. By switching the order of acts 330 and 335, the usage count of the block is updated each time an attempt is made to store the data in the block. Otherwise, the usage count would be updated only once even though the block was written into several times. Additionally, if the erase operation includes the act of returning the cells of a block to their un-programmed digital state, it may be preferred to update the count field for this operation since the erase operation has the effect of wearing out the block.

There are several alternatives that can be used with these preferred embodiments. For example, instead of using software and/or hardware components 120 in the host device 200, a controller in the memory device can be used to implement control logic responsible for some or all of the functionality described in the flow chart in FIG. 3. In another alternative embodiment, a block's "free" and "count" status can be determined without the use of sideband fields (accordingly, sideband fields should not be read into the claims unless explicitly recited therein). For example, a block's "free" and "count" status can be tracked using file system structures stored in the memory device. A "file system structure" can take the form of an allocation table, a listing of stored files, a search tree, a boot block, a partition header, a partition footer, and a description of contents of the memory device. Of course, other file system structures in addition to those listed above can be used. In operation, the host device's file system examines the file system structures to determine the "free" and "count" status of a given block from the file system structures.

Additionally, with any of the preferred embodiments described above, a write-many memory device can comprise a plurality of blocks of memory that are limited to a maximum number of writes and one or more additional blocks that are either limited to a different number of writes or that have no limit at all. For example, it may be preferred not to restrict the number of writes to the blocks that store file system structures since these structures are frequently updated by the host device's file system.

It is intended that the foregoing detailed description be understood as an illustration of selected forms that the invention can take and not as a definition of the invention. It is only the following claims, including all equivalents, that are intended to define the scope of this invention. Finally, it should be noted that any aspect of any of the preferred embodiments described herein can be used alone or in combination with one another.

What is claimed is:

1. A method for limiting a number of writes to a write-many memory device, the method comprising:
    (a) providing a write-many memory device comprising a plurality of blocks of memory, each block being limited to N number of writes, wherein N is fewer than a maximum; allowable number of qualified writes to the block; and
    (b) storing data in a block of memory only if there have been fewer than N number of writes to the block.

2. The invention of claim 1, wherein each block comprises a sideband field storing data indicating how many times the block has been written into, and wherein (b) comprises storing data in a block of memory only if the data stored in the sideband field of the block indicates that there have been fewer than N number of writes to the block.

3. The invention of claim 2, wherein each block further comprises an additional sideband field storing data indicating whether the block is free, and wherein (b) comprises storing data in a block of memory only if the data stored in the sideband field of the block indicates that there have been fewer than N number of writes to the block and the data stored in the additional sideband field of the block indicates that the block is free.

4. The invention of claim 1, wherein the write-many memory device stores a file system structure that indicates how many times each block has been written into, and wherein (b) comprises storing data in a block of memory only if the data stored in the file system structure indicates that there have been fewer than N number of writes to the block.

5. The invention of claim 1, wherein the write-many memory device is coupled with a host device, and wherein (b) comprises storing data in a block of memory only if the host device determines there have been fewer than N number of writes to the block.

6. The invention of claim 1, wherein the write-many memory device comprises a controller, and wherein (b) comprises storing data in a block of memory only if the controller determines there have been fewer than N number of writes to the block.

7. The invention of claim 1, wherein N is chosen by a manufacturer of the write-many memory device to segment a write-many memory device market.

8. A method for limiting a number of writes to a write-many memory device, the method comprising:
    (a) providing a write-many memory device comprising a plurality of blocks of memory, each block comprising a first sideband field storing data indicating whether the block is free and a second sideband field storing data indicating how many times the block has been written into;
    (b) determining whether there are enough blocks free to store a file; and
    (c) if there are enough blocks free to store the file:
        (c1) storing the file in at least some of the blocks free to store the file;
        (c2) in the first sideband fields of the blocks storing the file, storing data indicating that the blocks are not free; and
        (c3) in the second sideband fields of the blocks storing the file, updating the data indicating how many times the blocks have been written into; wherein a maximum number of times a block can be written into is fewer than a maximum allowable number of qualified writes to the write-many memory device.

9. The invention of claim 8, wherein (c1) is performed before (c3).

10. The invention of claim 8, wherein (c3) is performed before (c1).

11. The invention of claim 8 further comprising:
    (d) if there are not enough blocks free to store the file, selecting a previously-stored file to be erased, the previously-stored file being stored in a first set of blocks.

12. The invention of claim 11 further comprising:
    (e) if the second sideband fields of the first set of blocks indicate that the first set of blocks has been written into fewer than a maximum number of times:
        (e1) in the first sideband fields of the first set of blocks, storing data indicating that the blocks are free; and
        (e2) storing the file in at least some of the first set of blocks.

13. The invention of claim 11 further comprising:
    (e) if the second sideband fields of the first set of blocks indicate that the first set of blocks has been written into a maximum number of times, preventing the previously-stored file from being erased.

14. The invention of claim 11 further comprising:
    (e) if some of the second sideband fields of the first set of blocks indicate that their respective blocks have been written into fewer than a maximum number of times and others of the second sideband fields indicate that their respective blocks have been written into a maximum number of times, in the first sideband fields of the blocks that have been written into fewer than a maximum number of times, storing data indicating that those blocks are free to be written into.

15. The invention of claim 14 further comprising, between (d) and (e), informing a user of the amount of space that will become available if the previously-stored file is erased and requesting the user to confirm that the previously-stored file should be erased.

16. The invention of claim 8, wherein the maximum number of times a block can be written into is chosen by a manufacturer of the write-many memory device to segment a write-many memory device market.

17. A write-many memory device comprising a plurality of blocks of memory, each block being limited to N number of writes; wherein N is fewer than a maximum allowable number of qualified writes to the block.

18. The invention of claim 17 further comprising a host device coupled with the write-many memory device, wherein the host device is operative to store data in a block of memory only if there have been fewer than N number of writes to the block.

19. The invention of claim 17, wherein each block comprises a first sideband field storing data indicating whether the block is free and a second sideband field storing data indicating how many times the block has been written into.

20. The invention of claim 17, wherein N is chosen by a manufacturer of the write-many memory device to segment a write-many memory device market.

21. The invention of claim 1, wherein N is chosen by a manufacturer of the write-many memory device.

22. The invention of claim 1, wherein N is chosen to limit use of a program stored in the write-many memory device.

23. The invention of claim 1, wherein the write-many memory device comprises at least one additional block of memory that is not limited to N number of writes.

24. The invention of claim 23, wherein the at least one additional block of memory is limited to M number of writes, wherein M≠N.

25. The invention of claim 23, wherein the at least one additional block of memory is not limited to a predetermined number of writes.

26. The invention of claim 23, wherein the at least one additional block of memory stores a file system structure.

27. The invention of claim 8, wherein the maximum number of times a block can be written into is chosen by a manufacturer of the write-many memory device.

28. The invention of claim 8, wherein the maximum number of times a block can be written into is chosen to limit use of a program stored in the write-many memory device.

29. The invention of claim 8, wherein the maximum number of times a block can be written into is equal to a maximum allowable number of qualified writes to the write-many memory device.

30. The invention of claim 8, wherein the write-many memory device comprises at least one additional block of memory comprising a different write limit that the plurality of blocks.

31. The invention of claim 30, wherein the at least one additional block of memory stores a file system structure.

32. The invention of claim 8, wherein the write-many memory device comprises at least one additional block of memory that is not limited to a predetermined number of writes.

33. The invention of claim 32, wherein the at least one additional lock of memory stores a file system structure.

34. The invention of claim 17, wherein N is chosen by a manufacturer of the write-many memory device.

35. The invention of claim 17, wherein N is chosen to limit use of a program stored in the write-many memory device.

36. The invention of claim 17, wherein the write-many memory device comprises at least one additional block of memory that is not limited to N number of writes.

37. The invention of claim 36, wherein the at least one additional block of memory is limited to M number of writes, wherein M≠N.

38. The invention of claim 36, wherein the at least one additional block of memory is not limited to a predetermined number of writes.

39. The invention of claim 36, wherein the at least one additional block of memory stores a file system structure.

40. The invention of claim 1 wherein N=1.

41. The invention of the claim 17 wherein N=1.

42. A method for creating a write-once memory device from a write-many memory device, the method comprising:
  (a) providing a memory device comprising a memory array comprising a plurality of write-many memory cell; and
  (b) rendering at least some of the write-many memory cells in the memory array as write-once memory cells by preventing more than one write to said at least some of the write-many memory cells.

43. The invention of claim 42 wherein the memory device comprises a modular memory device that is removable couplable whit a host device.

44. The invention of claim 42 wherein said at least some of the write-many memory cells in the memory array are rendered as write-once memory cells by a manufacturer of the memory device.

45. The invention of claim 42 wherein the memory array is organized into blocks of memory, and wherein a sideband field of a block is used in preventing more than one write to said at least some of the write-many memory cells.

* * * * *

UNITED STATES PATENT AND TRADEMARK OFFICE
CERTIFICATE OF CORRECTION

| | | |
|---|---|---|
| PATENT NO. | : 7,000,063 B2 | Page 1 of 1 |
| APPLICATION NO. | : 09/972787 | |
| DATED | : February 14, 2006 | |
| INVENTOR(S) | : David R. Friedman et al. | |

It is certified that error appears in the above-identified patent and that said Letters Patent is hereby corrected as shown below:

<u>In the Claims</u>

Column 7, in claim 1, line 30, immediately after "maximum" delete ";" (semicolon).

Column 10, in claim 40, line 21, immediately after "claim 1" insert --,-- (comma).

Column 10, in claim 41, line 22, immediately after "claim 17" insert --,-- (comma).

Column 10, in claim 43, line 32, immediately after "claim 42" insert --,-- (comma).

Column 10, in claim 43, line 33, after "device that is" delete "removable" and substitute --removably-- in its place.

Column 10, in claim 43, line 34, after "couplable" delete "whit" and substitute --with-- in its place.

Column 10, in claim 44, line 35, immediately after "claim 42" insert --,-- (comma).

Column 10, in claim 45, line 39, immediately after "claim 42" insert --,-- (comma).

Signed and Sealed this

Second Day of January, 2007

JON W. DUDAS
*Director of the United States Patent and Trademark Office*